United States Patent
Tomioka

(10) Patent No.: US 11,791,330 B2
(45) Date of Patent: Oct. 17, 2023

(54) ELECTROSTATIC PROTECTION CIRCUIT AND SEMICONDUCTOR DEVICE

(71) Applicant: ABLIC Inc., Tokyo (JP)

(72) Inventor: Tsutomu Tomioka, Tokyo (JP)

(73) Assignee: ABLIC, Inc., Nagano (JP)

( * ) Notice: Subject to any disclaimer, the term of this patent is extended or adjusted under 35 U.S.C. 154(b) by 146 days.

(21) Appl. No.: 17/112,070

(22) Filed: Dec. 4, 2020

(65) Prior Publication Data
US 2021/0193649 A1    Jun. 24, 2021

(30) Foreign Application Priority Data
Dec. 24, 2019    (JP) .................................. 2019-233133

(51) Int. Cl.
*H01L 27/02*    (2006.01)
*H02H 9/04*    (2006.01)

(52) U.S. Cl.
CPC ...... *H01L 27/0292* (2013.01); *H01L 27/0255* (2013.01); *H01L 27/0266* (2013.01); *H01L 27/0281* (2013.01); *H01L 27/0288* (2013.01); *H02H 9/046* (2013.01)

(58) Field of Classification Search
CPC ............ H01L 27/0292; H01L 27/0255; H01L 27/0266; H01L 27/0281; H01L 27/0288; H01L 27/0296; H02H 9/046
USPC ........................................................ 361/56
See application file for complete search history.

(56) References Cited

U.S. PATENT DOCUMENTS

| | | | |
|---|---|---|---|
| 5,545,909 A | 8/1996 | Williams et al. | |
| 6,538,290 B1 | 3/2003 | Ishikawa et al. | |
| 2002/0105766 A1* | 8/2002 | Lin ..................... | H01L 27/0285 361/56 |
| 2003/0137789 A1* | 7/2003 | Walker ................ | H01L 27/0266 361/56 |
| 2008/0024946 A1* | 1/2008 | Sato .................... | H01L 27/0251 257/E27.015 |
| 2008/0175045 A1* | 7/2008 | Lin ...................... | G11C 7/1084 365/182 |
| 2014/0039520 A1 | 2/2014 | Haider et al. | |
| 2016/0147239 A1* | 5/2016 | Yan ......................... | G05F 1/575 323/280 |
| 2017/0025403 A1 | 1/2017 | Padmanabhan et al. | |
| 2020/0235571 A1* | 7/2020 | Concannon ............ | H03H 11/02 |

FOREIGN PATENT DOCUMENTS

| | | | |
|---|---|---|---|
| CN | 102956633 A * | 3/2013 | ......... H01L 27/0266 |
| CN | 107658856 A * | 2/2018 | ............... H02H 9/02 |
| JP | H08227976 A | 9/1996 | |

(Continued)

OTHER PUBLICATIONS

Japanese Office Action with English machine translation, dated Jun. 26, 2023, pp. 1-6, Issued in Japanese Patent Application No. 2019-233133, Japan Patent Office, Chiyoda Tokyo, Japan.

*Primary Examiner* — Thienvu V Tran
*Assistant Examiner* — Sreeya Sreevatsa
(74) *Attorney, Agent, or Firm* — Crowell & Moring LLP

(57) ABSTRACT

An electrostatic protection circuit and a semiconductor device include: a first diode whose anode is connected to a signal terminal; a second diode whose cathode is connected to a cathode of the first diode and whose anode is connected to a GND terminal; and a depletion type MOS transistor connected in parallel with the first diode.

8 Claims, 6 Drawing Sheets

(56) References Cited

FOREIGN PATENT DOCUMENTS

| JP | 2000-223499 A | 8/2000 |
| JP | 2008-034524 A | 2/2008 |
| JP | 2015-095541 A | 5/2015 |
| JP | 2016-052197 A | 4/2016 |

* cited by examiner

ELECTROSTATIC PROTECTION CIRCUIT AND SEMICONDUCTOR DEVICE

RELATED APPLICATIONS

This application claims priority to Japanese Patent Application No. 2019-233133, filed on Dec. 24, 2019, the entire content of which is incorporated herein by reference.

BACKGROUND OF THE INVENTION

1. Field of the Invention

The present invention relates to an electrostatic protection circuit of a semiconductor device.

2. Description of the Related Art

A conventional electrostatic protection circuit of a semiconductor device includes a PNP transistor having an emitter terminal connected to a signal terminal and a collector terminal connected to a GND terminal. Even if the potential at a signal terminal drops under the potential of the GND terminal, no operational problem arises in the semiconductor device having the electrostatic protection circuit explained above (for example, see Japanese Patent Application Laid-Open No. 2000-223499).

As illustrated in FIG. 6, the base of an electrostatic protection PNP transistor (indicated by a solid line) of an electrostatic protection circuit 60 fabricated in a CMOS process is generally formed from an N-well.

The PNP transistor thus formed can be regarded as a series connection of a diode D1 with a P-type region 61 as an anode and the N-well as a cathode, and a diode D2 with a P-type region 62 as an anode and the N-well as a cathode. Further, the anode of the diode D1, the N-well, and the P-type substrate can be respectively regarded as the emitter, the base, and the collector of a parasitic PNP transistor (indicated by a dashed line).

Leak current of the diode D2 flows through the diode D1 at high temperature. The parasitic PNP transistor allows a collector current which is amplified from the leak current by the current amplification factor to flow. Since the collector current of the parasitic PNP transistor in the conventional electrostatic protection circuit, accordingly, flows from the signal terminal to the GND terminal at high temperature, the input current of the signal terminal increases.

SUMMARY OF THE INVENTION

It is an object of the present invention to provide an electrostatic protection circuit and a semiconductor device in which the amount of increase in input current of a signal terminal is small at high temperature.

An electrostatic protection circuit according to an embodiment of the present invention includes: a first diode whose anode is connected to a signal terminal; a second diode whose cathode is connected to a cathode of the first diode and whose anode is connected to a GND terminal; and a depletion type MOS transistor connected in parallel with the first diode.

Further, a semiconductor device according to an embodiment of the present invention includes the above electrostatic protection circuit between the signal terminal and an internal circuit.

According to the electrostatic protection circuit of the present invention, since the depletion type MOS transistor is provided in parallel with the first diode, there can be provided the electrostatic protection circuit and the semiconductor device in which the amount of increase in the input current of the signal terminal is small at high temperature.

DETAILED DESCRIPTION OF THE PREFERRED EMBODIMENTS

Embodiments of the present invention will be described below with reference to the accompanying drawings.

A semiconductor device according to the embodiments of the present invention includes a signal terminal which supplies and receives signals, an internal circuit connected to the signal terminal, and an electrostatic protection circuit provided between the signal terminal and the internal circuit. The detailed description of the internal circuit of the semiconductor device will be omitted.

First Embodiment

Figure 1:
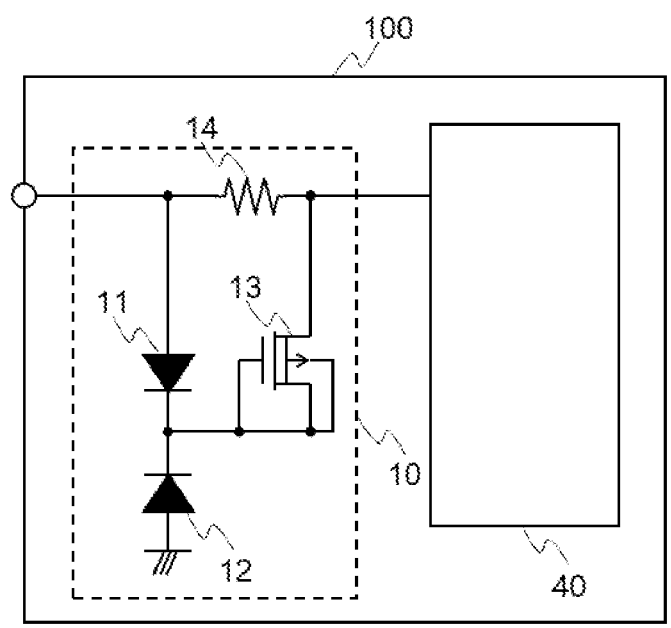
FIG. 1 is a circuit diagram illustrating a semiconductor device including an electrostatic protection circuit according to a first embodiment.

FIG. 1 is a circuit diagram illustrating a semiconductor device including an electrostatic protection circuit according to the first embodiment.

A semiconductor device 100 includes an electrostatic protection circuit 10 and an internal circuit 40. The electrostatic protection circuit 10 includes diodes 11 and 12, a depletion type p-channel MOS transistor (hereinafter pMOS transistor) 13, and a resistor 14. The resistor 14 is a gate protection resistor for protecting the gate of a transistor of the internal circuit 40.

The diode 11 has an anode connected to a signal terminal and a cathode connected to the cathode of the diode 12. The anode of the diode 12 is connected to a GND terminal. The pMOS transistor 13 has a drain connected to the internal circuit 40, and gate, source, and bulk connected to the cathode of the diode 11. The resistor 14 is connected between the anode of the diode 11 and the drain of the pMOS transistor 13.

The operation of the electrostatic protection circuit 10 of the first embodiment will be described next. A parasitic PNP transistor is formed from the anode and cathode of the diode 11 and the P-type substrate in the electrostatic protection circuit 10 as in the conventional art.

<Steady State in which Voltage at Signal Terminal is Higher than Voltage at GND Terminal>

Though the gate and source of the pMOS transistor 13 are connected to each other, there is a channel between the drain and the source since the pMOS transistor 13 is depletion type. By the current supply capability of the pMOS transistor 13 which is sufficiently larger than the leak current flowing through the diode 12, a voltage drop due to the on-resistance of the pMOS transistor 13 is close to 0 V. This causes most of the leak current of the diode 12 to flow through the pMOS transistor 13 and not to flow into the diode 11. Since no current flows into the parasitic PNP transistor, the current flowing into the signal terminal accordingly can be made small.

<Reverse Connection State in which Voltage at Signal Terminal is Lower than Voltage at GND Terminal>

The pMOS transistor 13 operates as a constant current source with an overdrive voltage |VTPD| (threshold voltage). Although reverse current flows into the signal terminal from the GND terminal through the diode 12 and the pMOS transistor 13, the reverse current can be reduced to a current admitted by the pMOS transistor 13. There is thus no problem for the operation of the semiconductor device even in the reverse connection state even though the pMOS transistor 13 is connected in parallel with the diode 11.

As described above, in the electrostatic protection circuit 10 according to the first embodiment, the amount of increase in the input current of the signal terminal can be reduced by the addition of the pMOS transistor 13 provided in parallel with the diode 11 since no current flows into the parasitic transistor at high temperature.

Figure 2:
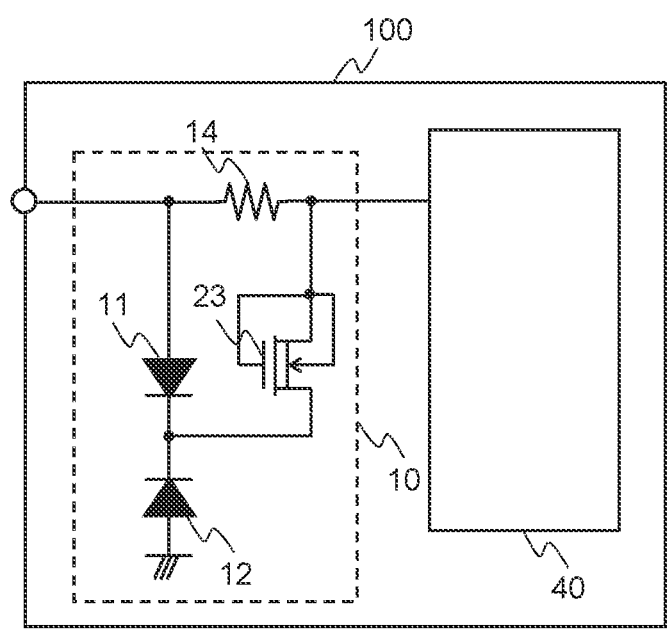
FIG. 2 is a circuit diagram illustrating another example of an electrostatic protection circuit according to the first embodiment.

FIG. 2 is a circuit diagram illustrating another example of an electrostatic protection circuit according to the first embodiment. The same effect can also be obtained even by replacing the pMOS transistor 13 with a depletion type n-channel MOS transistor 23 connected as illustrated in FIG. 2.

Second Embodiment

Figure 3:
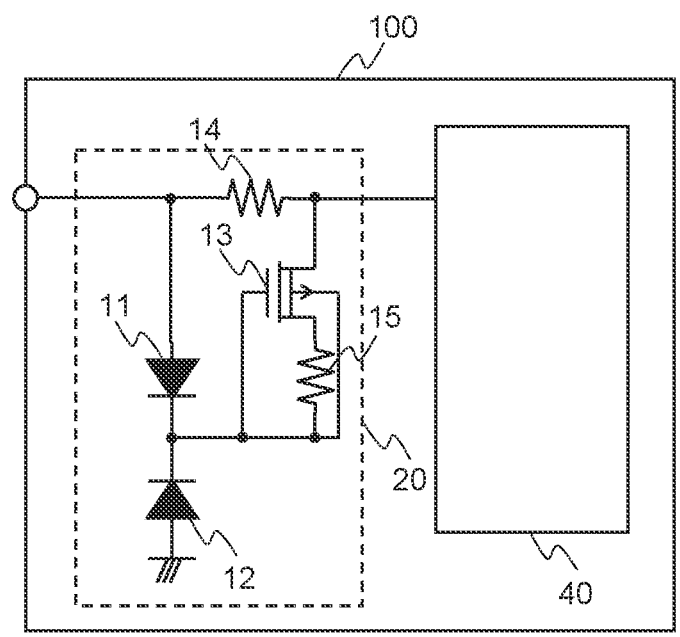
FIG. 3 is a circuit diagram illustrating a semiconductor device including an electrostatic protection circuit according to a second embodiment.

FIG. 3 is a circuit diagram illustrating a semiconductor device including an electrostatic protection circuit according to the second embodiment.

An electrostatic protection circuit 20 of FIG. 3 further includes a resistor 15 compared to the electrostatic protection circuit 10 of FIG. 1. The same components as those in the electrostatic protection circuit 10 illustrated in FIG. 1 are given the same reference numerals to omit redundant description as appropriate.

<Steady State in which Voltage at Signal Terminal is Higher than Voltage at GND Terminal>

The resistor 15 is connected between the source of the pMOS transistor 13 and the cathode of the diode 12. Since the resistance of the resistor 15 is set to be sufficiently small, the electrostatic protection circuit 20 can operate in the same manner as the electrostatic protection circuit 10 of FIG. 1.

<Reverse Connection State in which Voltage at Signal Terminal is Lower than Voltage at GND Terminal>

In the reverse connection state, the current flowing through the pMOS transistor 13 is approximately determined by |VTPD|/R. Here, R is the resistance of the resistor 15. In other words, this current may be set to a current value acceptable as a reverse current, reducing the size of the pMOS transistor 13 more than that in the electrostatic protection circuit 10 of the first embodiment.

As described above, in the electrostatic protection circuit 20 of the embodiment, the amount of increase in the input current of the signal terminal can be reduced by the addition of the pMOS transistor 13 and the resistor 15e provided in parallel with the diode 11 since no current flows into the parasitic transistor at high temperature.

Figure 4:
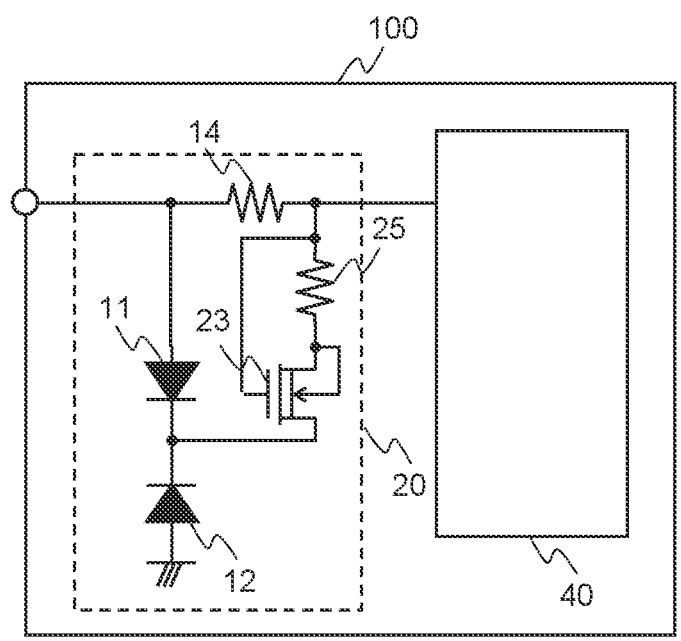
FIG. 4 is a circuit diagram illustrating another example of an electrostatic protection circuit according to the second embodiment.

FIG. 4 is a circuit diagram illustrating another example of an electrostatic protection circuit according to the second embodiment.

The same effect can also be obtained by replacing the pMOS transistor 13 and the resistor 15 with a depletion type n-channel MOS transistor 23 and a resistor 25 connected as illustrated in FIG. 4.

While the embodiments of the present invention have been described, the present invention is not limited to the aforementioned embodiments, and various changes can be made without departing from the scope of the present invention.

Figure 5:
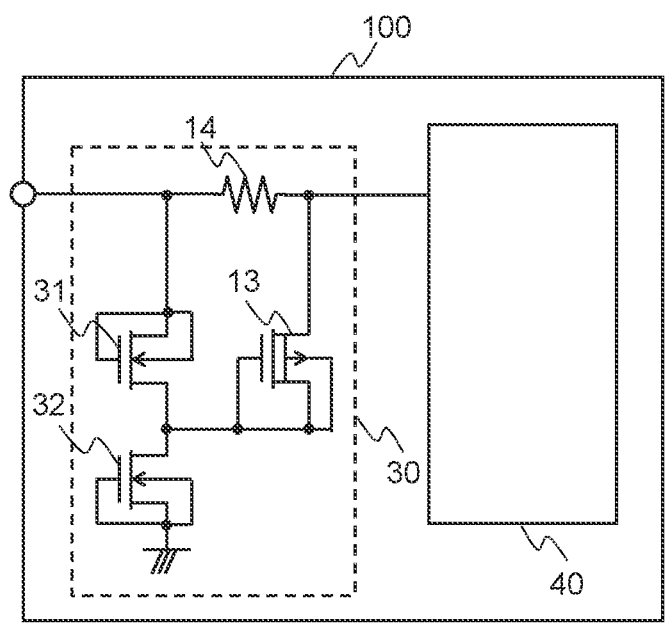
FIG. 5 is a circuit diagram illustrating a still another example of an electrostatic protection circuit according to the first embodiment.
Figure 6:
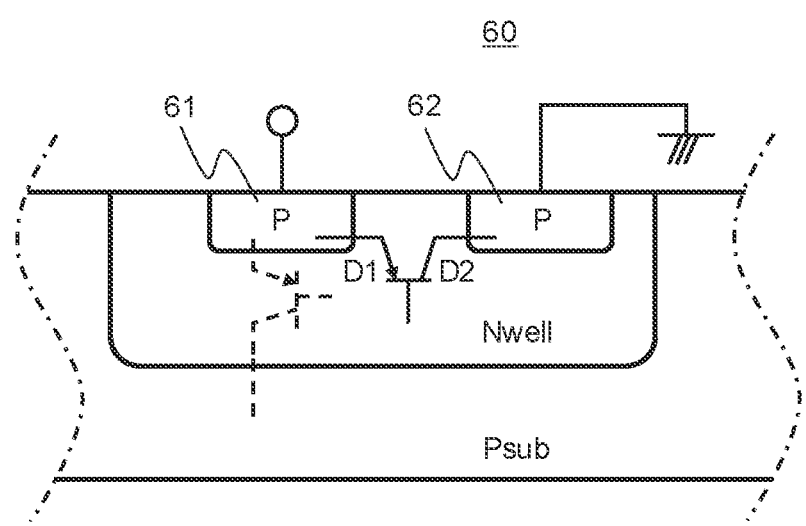
FIG. 6 is a sectional view of a semiconductor device including a conventional electrostatic protection circuit.

For example, the diode 11 and the diode 12 may be replaced with electrostatic protection elements such as MOS transistors. As an example, an electrostatic protection circuit 30 in which the diodes in the electrostatic protection circuit 10 of FIG. 1 are replaced with enhancement type n-channel MOS transistors 31, 32 is illustrated in FIG. 5 which shows a still another example of an electrostatic protection circuit according to the first embodiment.

Further, for example, the resistor 14 may be connected between the drain of the pMOS transistor 13 (the source of the nMOS transistor 23) and the internal circuit 40. In this case, for example, a resistor may be provided for protection between the connection point of the gate, source, and bulk of the pMOS transistor 13, and the cathode of the diode 11 in series with the path through the drain of the pMOS transistor 13 (the source of the nMOS transistor 23) and the bulk.

What is claimed is:

1. An electrostatic protection circuit configured to protect a signal terminal of an internal circuit of a semiconductor device, comprising:
    a first diode having an anode connected to the signal terminal;
    a second diode having a cathode connected to a cathode of the first diode and an anode connected to a GND terminal; and
    a depletion type MOS transistor connected in parallel with the first diode, wherein the depletion type MOS transistor is a pMOS transistor having a drain directly connected to at least one of the internal circuit or the anode of the first diode, and having a gate, a source, and a bulk directly connected to the cathode of the first diode.

2. The electrostatic protection circuit according to claim 1, wherein a resistor is connected between the source of the pMOS transistor and the cathode of the first diode.

3. The semiconductor device comprising:
    the electrostatic protection circuit according to claim 2;
    the internal circuit; and
    the signal terminal,
    wherein the anode of the first diode and the drain of the pMOS transistor are connected between the signal terminal and the internal circuit.

4. The semiconductor device comprising:
    the electrostatic protection circuit according to claim 1;
    the internal circuit; and
    the signal terminal,
    wherein the anode of the first diode and the drain of the pMOS transistor are connected between the signal terminal and the internal circuit.

5. The electrostatic protection circuit according to claim 1, further comprising a gate protection resistor connected between the drain of the pMOS transistor and the anode of the first diode.

6. The semiconductor device comprising:
   the electrostatic protection circuit according to claim 5;
   the internal circuit; and
   the signal terminal,
   wherein the anode of the first diode, the drain of the pMOS transistor, and the gate protection resistor are all connected between the signal terminal and the internal circuit.

7. The electrostatic protection circuit according to claim 1, further comprising a gate protection resistor connected between the drain of the pMOS transistor and the internal circuit.

8. The semiconductor device comprising:
   the electrostatic protection circuit according to claim 7;
   the internal circuit; and
   the signal terminal,
   wherein the anode of the first diode, the drain of the pMOS transistor, and the gate protection resistor are all connected between the signal terminal and the internal circuit.

* * * * *